(12) United States Patent
Chung et al.

(10) Patent No.: US 11,317,493 B2
(45) Date of Patent: Apr. 26, 2022

(54) LED ILLUMINATION DEVICE

(71) Applicant: PARAGON SEMICONDUCTOR LIGHTING TECHNOLOGY CO., LTD., New Taipei (TW)

(72) Inventors: Chia-Tin Chung, Miaoli County (TW); Pei-Chun Liu, New Taipei (TW)

(73) Assignee: PARAGON SEMICONDUCTOR LIGHTING TECHNOLOGY CO., LTD., New Taipei (TW)

( * ) Notice: Subject to any disclaimer, the term of this patent is extended or adjusted under 35 U.S.C. 154(b) by 76 days.

(21) Appl. No.: 16/920,498

(22) Filed: Jul. 3, 2020

(65) Prior Publication Data

US 2021/0298150 A1 Sep. 23, 2021

(30) Foreign Application Priority Data

Mar. 23, 2020 (TW) .................................. 109203272

(51) Int. Cl.
| | |
|---|---|
| *H05B 45/39* | (2020.01) |
| *H01L 33/62* | (2010.01) |
| *H05B 45/345* | (2020.01) |
| *F21V 23/00* | (2015.01) |

(52) U.S. Cl.
CPC ........... *H05B 45/39* (2020.01); *F21V 23/004* (2013.01); *F21V 23/005* (2013.01); *H01L 33/62* (2013.01); *H05B 45/345* (2020.01)

(58) Field of Classification Search
CPC ....... H05B 45/39; H05B 45/345; H01L 33/48; H01L 33/62; F21V 23/004; F21V 23/005
See application file for complete search history.

(56) References Cited

U.S. PATENT DOCUMENTS

| | | | | |
|---|---|---|---|---|
| 8,749,143 | B1* | 6/2014 | Saddig | F21S 41/153 |
| | | | | 315/82 |
| 8,994,296 | B1* | 3/2015 | Chan | H05B 45/10 |
| | | | | 315/362 |
| 9,730,282 | B2* | 8/2017 | Munday | H05B 45/10 |
| 10,021,742 | B2* | 7/2018 | Jiang | F21V 23/023 |
| 2008/0048496 | A1* | 2/2008 | Fisher | H01R 9/2425 |
| | | | | 307/18 |

(Continued)

*Primary Examiner* — Abdullah A Riyami
*Assistant Examiner* — Syed M Kaiser
(74) *Attorney, Agent, or Firm* — Li & Cai Intellectual Property (USA) Office

(57) ABSTRACT

An LED illumination device includes a circuit substrate, a bridge rectifier, a current-limiting chip, a resistance switching module and an LED group. The bridge rectifier is disposed on the circuit substrate and electrically connected to the circuit substrate. The current-limiting chip is disposed on the circuit substrate and electrically connected to the circuit substrate. The resistance switching module is disposed on the circuit substrate and electrically connected to the circuit substrate. The LED group includes a plurality of LED chips disposed on the circuit substrate and electrically connected to the circuit substrate. The bridge rectifier, the current-limiting chip, the resistance switching module and the LED group are electrically connected with each other. The resistance switching module includes a plurality of resistance switches and a plurality of resistor elements respectively corresponding to the resistance switches, and each of the resistance switches includes a physical switching key that is exposed.

5 Claims, 7 Drawing Sheets

(56) References Cited

U.S. PATENT DOCUMENTS

| | | | | |
|---|---|---|---|---|
| 2008/0116818 A1* | 5/2008 | Shteynberg | ............ | H05B 45/24 |
| | | | | 315/192 |
| 2008/0218095 A1* | 9/2008 | Erhardt | ................... | H05B 45/42 |
| | | | | 315/224 |
| 2010/0277905 A1* | 11/2010 | Janik | ...................... | F21V 29/763 |
| | | | | 362/235 |
| 2010/0321852 A1* | 12/2010 | Smith | ...................... | H01H 9/542 |
| | | | | 361/160 |
| 2012/0320595 A1* | 12/2012 | Enke | ...................... | H05B 45/00 |
| | | | | 362/249.06 |
| 2013/0249437 A1* | 9/2013 | Wang | ................... | H05B 47/185 |
| | | | | 315/307 |
| 2013/0328493 A1* | 12/2013 | Munday | ............... | H05B 45/375 |
| | | | | 315/201 |
| 2015/0334794 A1* | 11/2015 | Chou | ...................... | F21V 29/77 |
| | | | | 315/291 |
| 2016/0073458 A1* | 3/2016 | Takahashi | ............. | F21V 23/009 |
| | | | | 315/51 |
| 2017/0102114 A1* | 4/2017 | Xiong | ...................... | F21K 9/278 |
| 2017/0110905 A1* | 4/2017 | Simmet | ................... | F21S 9/022 |
| 2017/0286336 A1* | 10/2017 | Schie | ...................... | H05B 45/37 |
| 2017/0347423 A1* | 11/2017 | Xiong | ...................... | H05B 47/24 |

* cited by examiner

LED ILLUMINATION DEVICE

CROSS-REFERENCE TO RELATED PATENT APPLICATION

This application claims the benefit of priority to Taiwan Patent Application No. 109203272, filed on Mar. 23, 2020. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an illumination device, and more particularly to an LED (light-emitting diode) illumination device.

BACKGROUND OF THE DISCLOSURE

A conventional LED illumination device can only be used according to a factory setting, such as a fixed current and a fixed electric power, so that the range of application thereof is limited.

SUMMARY OF THE DISCLOSURE

In response to the above-referenced technical inadequacies, the present disclosure provides an LED illumination device.

In one aspect, the present disclosure provides an LED illumination device, including a circuit substrate, a bridge rectifier, a current-limiting chip, a resistance switching module and an LED group. The bridge rectifier is disposed on the circuit substrate and electrically connected to the circuit substrate. The current-limiting chip is disposed on the circuit substrate and electrically connected to the circuit substrate. The resistance switching module is disposed on the circuit substrate and electrically connected to the circuit substrate. The LED group includes a plurality of LED chips disposed on the circuit substrate and electrically connected to the circuit substrate. The bridge rectifier, the current-limiting chip, the resistance switching module and the LED group are electrically connected with each other. The bridge rectifier is electrically connected to a power source, and an alternating current generated by the power source is converted into a direct current through the bridge rectifier. The current-limiting chip is electrically connected to the bridge rectifier so as to adjust a current value of the direct current. The resistance switching module includes a plurality of resistance switches and a plurality of resistor elements respectively corresponding to the resistance switches, each of the resistance switches includes a physical switching key that is exposed, and the physical switching key is movably disposed on a resistance ON position for allowing the direct current to pass through the corresponding resistor element, or a resistance OFF position for preventing the direct current from passing through the corresponding resistor element.

In another aspect, the present disclosure provides an LED illumination device, including a circuit substrate, a bridge rectifier, a current-limiting chip, a resistance switching module and an LED group. The bridge rectifier is disposed on the circuit substrate and electrically connected to the circuit substrate. The current-limiting chip is disposed on the circuit substrate and electrically connected to the circuit substrate. The resistance switching module is disposed on the circuit substrate and electrically connected to the circuit substrate. The LED group includes a plurality of LED chips disposed on the circuit substrate and electrically connected to the circuit substrate. The bridge rectifier, the current-limiting chip, the resistance switching module and the LED group are electrically connected with each other. The resistance switching module includes a plurality of resistance switches and a plurality of resistor elements respectively corresponding to the resistance switches, and each of the resistance switches includes a physical switching key that is exposed.

In yet another aspect, the present disclosure provides an LED illumination device, including a circuit substrate, a bridge rectifier, a first current-limiting chip, a second current-limiting chip, a first resistance switching module, a second resistance switching module, a first LED group and a second LED group. The bridge rectifier is disposed on the circuit substrate and electrically connected to the circuit substrate. The first current-limiting chip is disposed on the circuit substrate and electrically connected to the circuit substrate. The second current-limiting chip is disposed on the circuit substrate and electrically connected to the circuit substrate. The first resistance switching module is disposed on the circuit substrate and electrically connected to the circuit substrate. The second resistance switching module is disposed on the circuit substrate and electrically connected to the circuit substrate. The first LED group includes a plurality of first LED chips disposed on the circuit substrate and electrically connected to the circuit substrate. The second LED group includes a plurality of second LED chips disposed on the circuit substrate and electrically connected to the circuit substrate. The bridge rectifier, the first current-limiting chip, the first resistance switching module and the first LED group are electrically connected with each other. The bridge rectifier, the second current-limiting chip, the second resistance switching module and the second LED group are electrically connected with each other. A first electric power received by the first LED group is different from or the same as a second electric power received by the second LED group. The first resistance switching module includes a plurality of first resistance switches and a plurality of first resistor elements respectively corresponding to the first resistance switches, and each of the first resistance switches includes a first physical switching key that is exposed. The second resistance switching module includes a plurality of second resistance switches and a plurality of second resistor elements respectively corresponding to the second resistance switches, and each of the second resistance switches includes a second physical switching key that is exposed.

Therefore, by virtue of "the resistance switching module including a plurality of resistance switches and a plurality of resistor elements respectively corresponding to the resistance switches" and "each of the resistance switches including a physical switching key that is exposed", the physical switching key can be movably disposed on a resistance ON position for allowing the direct current to pass through the corresponding resistor element (the resistor element is electrically conducted to the LED illumination devices), or a resistance OFF position for preventing the direct current from passing through the corresponding resistor element (the resistor element is electrically insulated from the LED illumination devices).

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
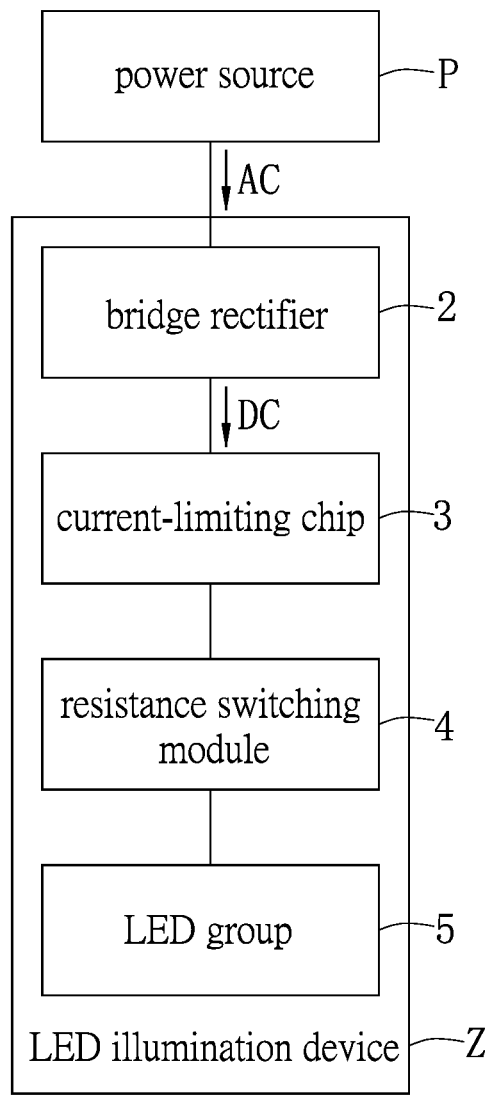
FIG. 1 is a functional block diagram of an LED illumination device according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1 to FIG. 4, a first embodiment of the present disclosure provides an LED illumination device Z, including a circuit substrate 1, a bridge rectifier 2, a current-limiting chip 3, a resistance switching module 4 (such as a resistance switcher) and an LED group 5. In addition, all of the bridge rectifier 2, the current-limiting chip 3, the resistance switching module 4 and the LED group 5 are disposed on the circuit substrate 1 and electrically connected to the circuit substrate 1, and the bridge rectifier 2, the current-limiting chip 3, the resistance switching module 4 and the LED group 5 are electrically connected with each other.

More particularly, as shown in FIG. 1, the bridge rectifier 2 is electrically connected to a power source P (such as household power supply, domestic power or a portable AC power supply), and an alternating current AC generated by the power source P can be converted into a direct current DC through the bridge rectifier 2. Moreover, the current-limiting chip 3 is electrically connected to the bridge rectifier 2 so as to adjust a current value of the direct current DC. That is to say, after the alternating current AC generated by the power source P is converted into the direct current DC through the bridge rectifier 2, the current value of the direct current DC can be adjusted into a predetermined current value through the current-limiting chip 3. However, the aforementioned description is merely an example and is not meant to limit the scope of the present disclosure.

Figure 2:
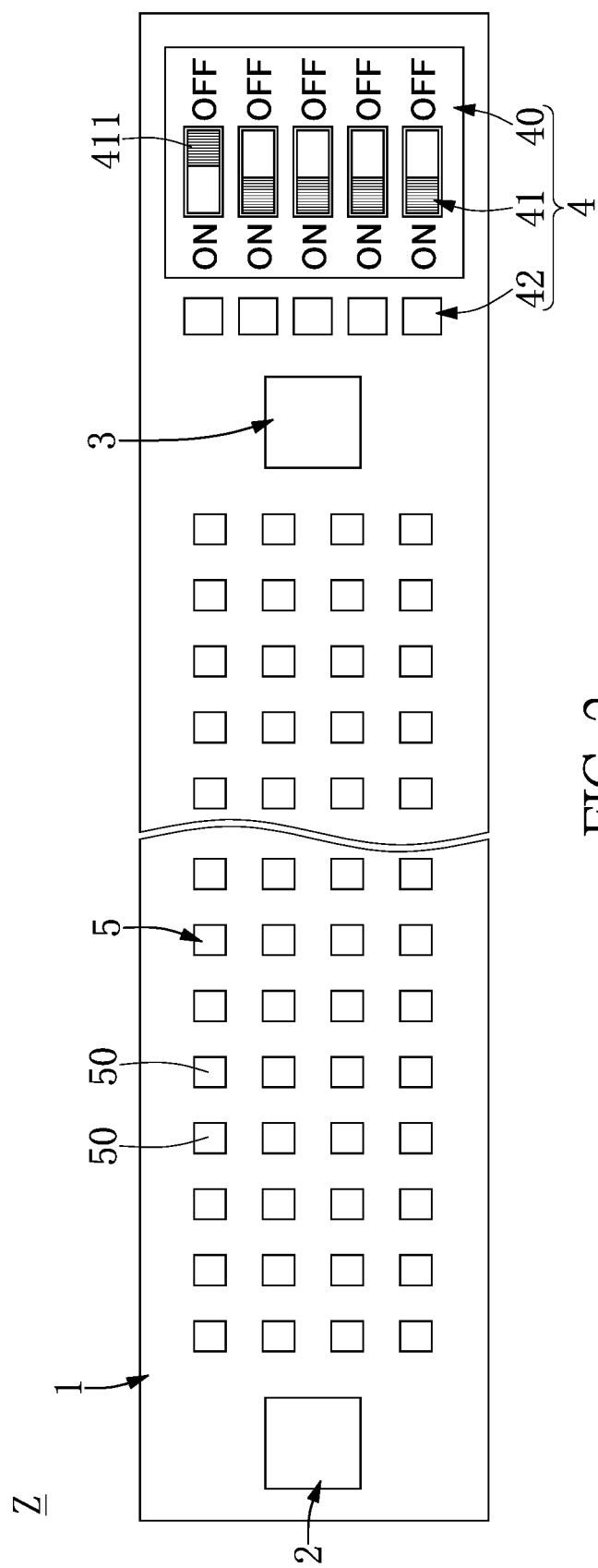
FIG. 2 is top schematic view of the LED illumination device according to the first embodiment of the present disclosure.
Figure 3:
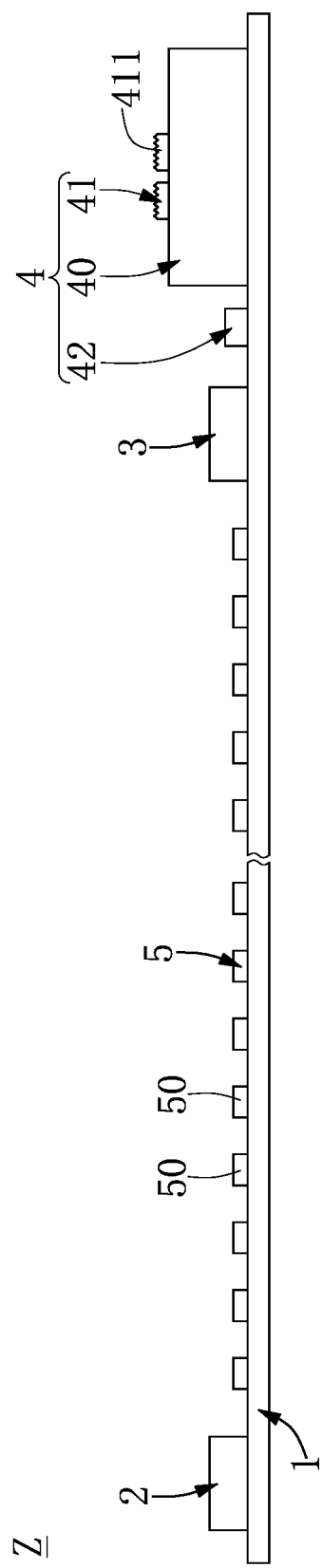
FIG. 3 is lateral schematic view of the LED illumination device according to the first embodiment of the present disclosure.
Figure 4:
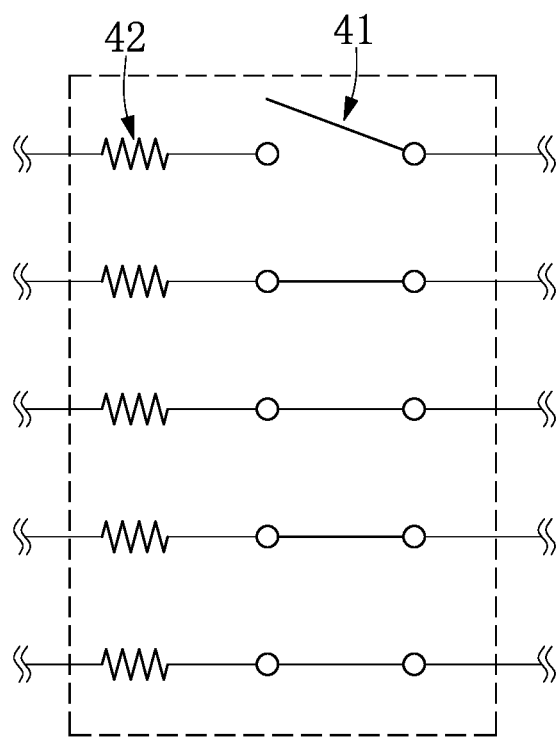
FIG. 4 is a schematic circuit diagram of a plurality of resistance switches and a plurality of resistor elements of the LED illumination device according to the first embodiment of the present disclosure.

More particularly, referring to FIG. 2 and FIG. 3, the resistance switching module 4 includes a plurality of resistance switches 41 and a plurality of resistor elements 42 respectively corresponding to (or selectively electrically connecting to) the resistance switches 41. For example, each of the resistance switches 41 includes an exposed physical switching key 411 and a movable conductive element (not shown) connected to the physical switching key 411, and the physical switching key 411 can be movably disposed on a resistance ON position (ON) for allowing the direct current DC to pass through the corresponding resistor element 42, or movably disposed on a resistance OFF position (OFF) for preventing (such as stopping or blocking) the direct current DC from passing through the corresponding resistor element 42. In addition, the resistance switching module 4 includes a carrying casing 40 (such as a carrier body) disposed on the circuit substrate 1, and the physical switching key 411 of each of the resistance switches 41 can be exposed from the carrying casing 40. Therefore, the physical switching key 411 of each of the resistance switches 41 can be movably disposed on the carrying casing 40, so that the movable conductive element (not shown) can be switched by the corresponding physical switching key 411 so as to be electrically connected to the corresponding resistor element 42 (the physical switching key 411 being disposed on the resistance ON position (ON)) or be electrically insulated from the corresponding resistor element 42 (the physical switching key 411 being disposed on a resistance OFF position (OFF). However, the aforementioned description is merely an example and is not meant to limit the scope of the present disclosure.

More particularly, referring to FIG. 2 and FIG. 3, the LED group 5 includes a plurality of LED chips 50 disposed on the circuit substrate 1 and electrically connected to the circuit substrate 1. For example, the LED chips 50 can be divided into a plurality of first LED chips for generating a first light source and a plurality of second LED chips for generating a second light source, and a wavelength of the first light source generated by the first LED chips is different from or the same as a wavelength of the second light source generated by the second LED chips. In addition, the LED chip 50 (such as the first LED chip or the second LED chip) may be a blue LED chip, a green LED chip, a red LED chip or any color LED chip. However, the aforementioned description is merely an example and is not meant to limit the scope of the present disclosure.

Second Embodiment

Referring to FIG. 5 to FIG. 8, a second embodiment of the present disclosure provides an LED illumination device Z, including a circuit substrate 1, a bridge rectifier 2, a first current-limiting chip 3A, a second current-limiting chip 3B, a first resistance switching module 4A, a second resistance switching module 4B, a first LED group 5A and a second LED group 5B. In addition, all of the bridge rectifier 2, the first current-limiting chip 3A, the second current-limiting chip 3B, the first resistance switching module 4A, the second resistance switching module 4B, the first LED group 5A and the second LED group 5B are disposed on the circuit substrate 1 and electrically connected to the circuit substrate 1. It should be noted that the bridge rectifier 2, the first current-limiting chip 3A, the first resistance switching module 4A and the first LED group 5A are electrically connected with each other, and the bridge rectifier 2, the second current-limiting chip 3B, the second resistance switching module 4B and the second LED group 5B are electrically connected with each other.

Figure 5:
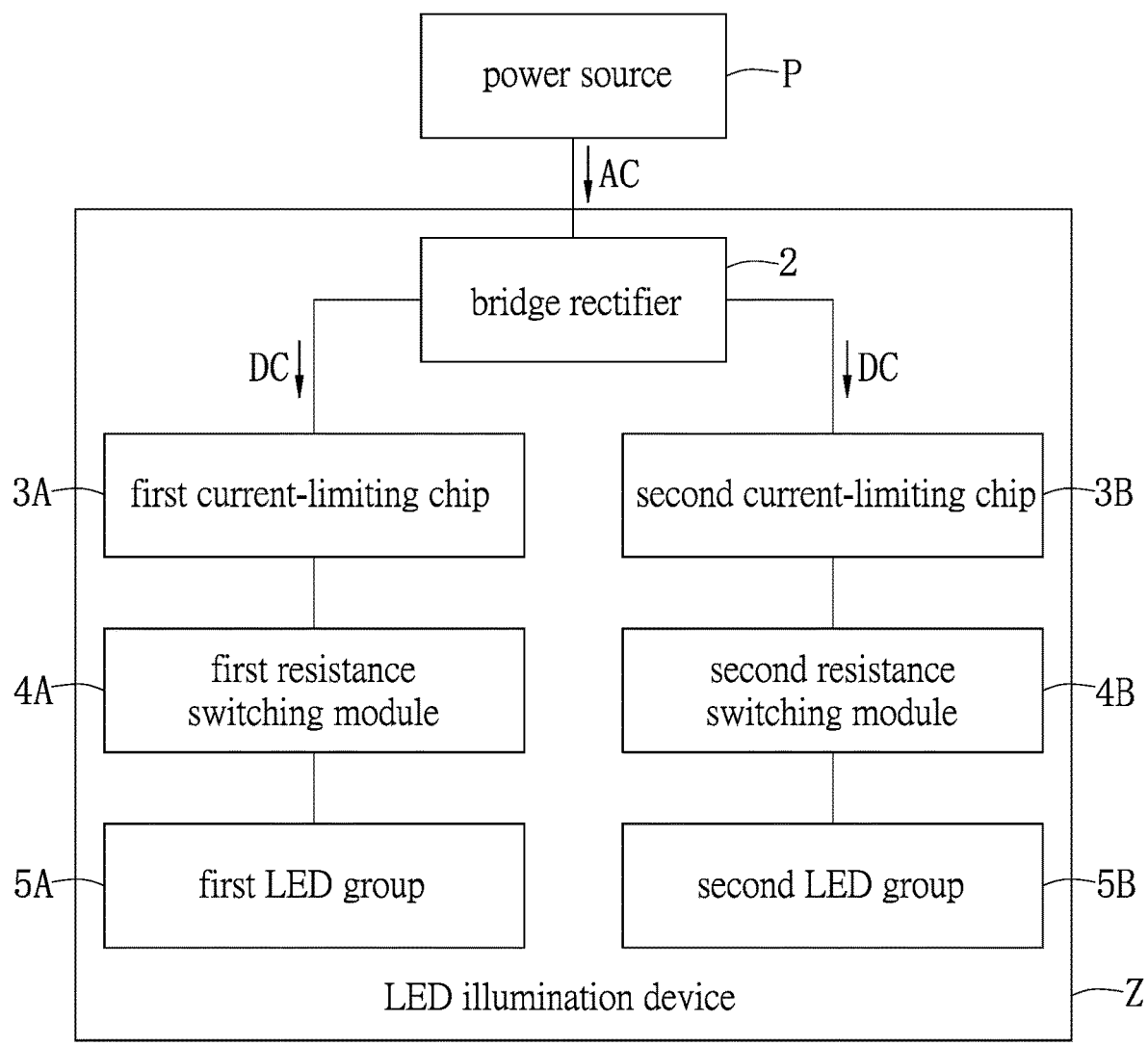
FIG. 5 is a functional block diagram of an LED illumination device according to a second embodiment of the present disclosure.

More particularly, as shown in FIG. 5, the bridge rectifier 2 is electrically connected to a power source P (such as household power supply, domestic power or a portable AC power supply), and an alternating current AC generated by the power source P can be converted into a first direct current DC and a second direct current DC through the bridge rectifier 2. Moreover, the first current-limiting chip 3A is electrically connected to the bridge rectifier 2 so as to adjust a first current value of the first direct current DC, and the second current-limiting chip 3B is electrically connected to the bridge rectifier 2 so as to adjust a second current value of the second direct current DC. That is to say, after the alternating current AC generated by the power source P is converted into the direct current DC through the bridge rectifier 2, the first current value of the first direct current DC can be adjusted into a first predetermined current value through the first current-limiting chip 3A, and the second current value of the second direct current DC can be adjusted into a second predetermined current value through the second current-limiting chip 3B. However, the aforementioned description is merely an example and is not meant to limit the scope of the present disclosure.

Figure 6:
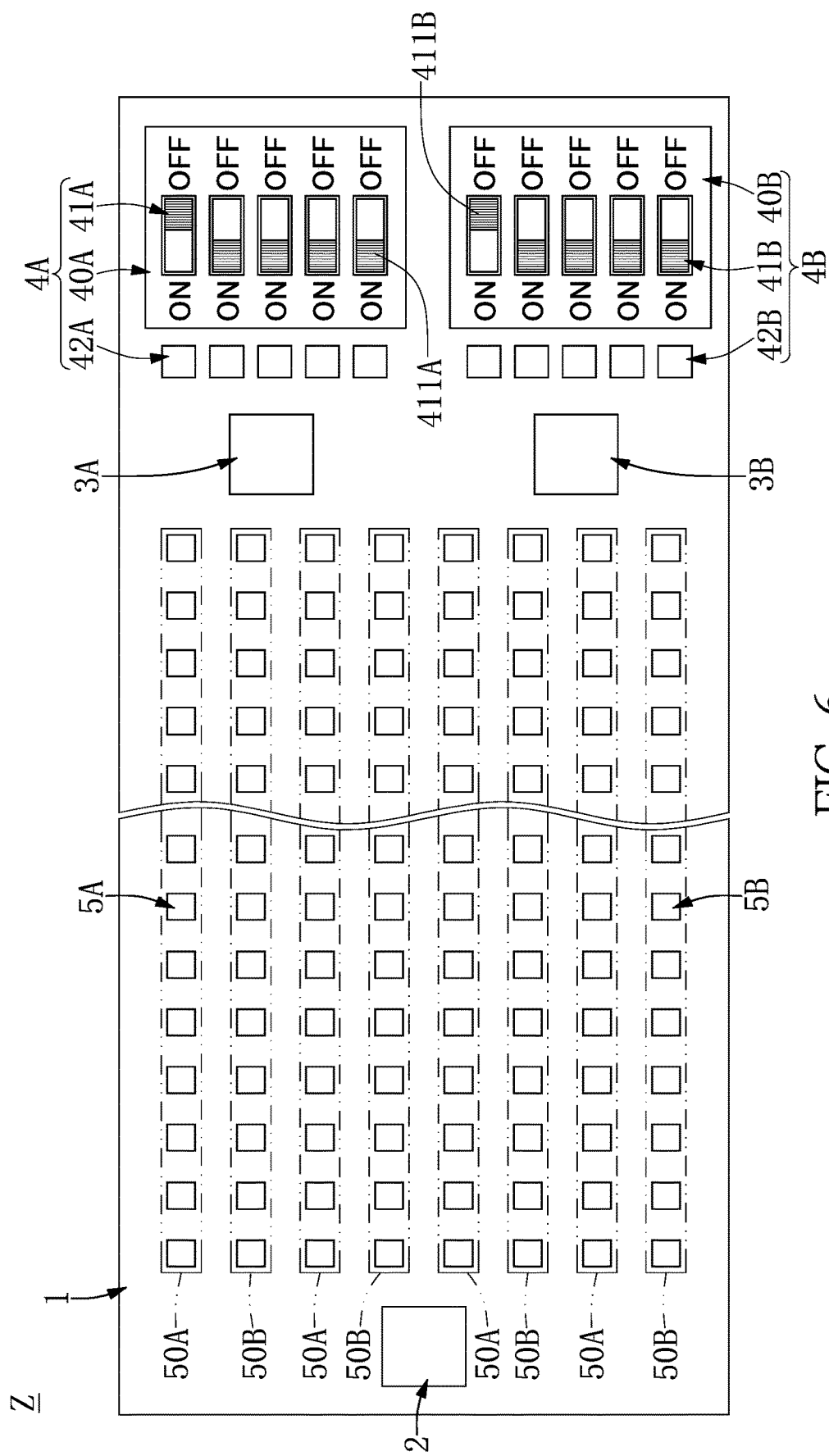
FIG. 6 is top schematic view of the LED illumination device according to the second embodiment of the present disclosure.
Figure 7:
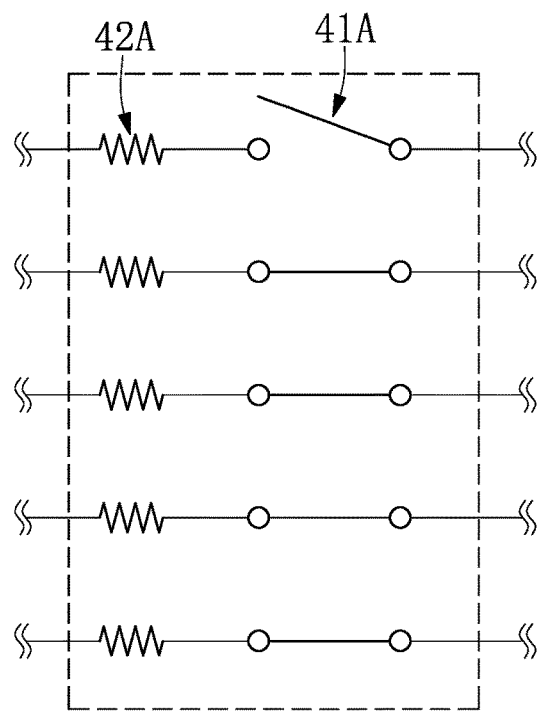
FIG. 7 is a schematic circuit diagram of a plurality of first resistance switches and a plurality of first resistor elements of the LED illumination device according to the second embodiment of the present disclosure.
Figure 8:
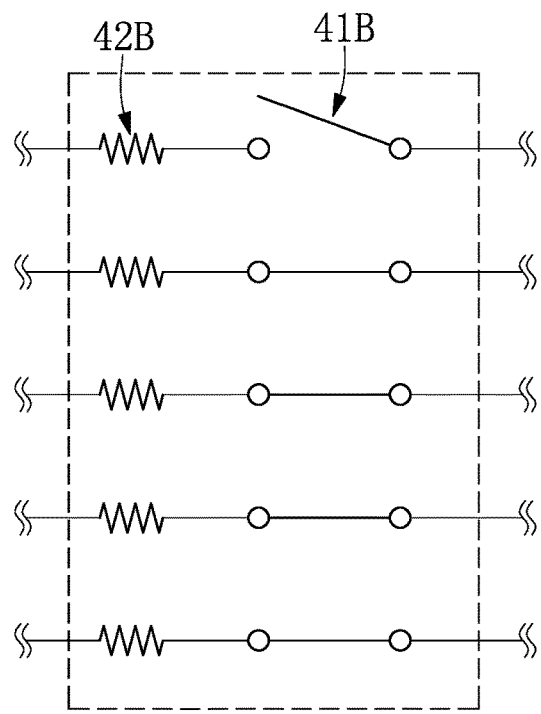
FIG. 8 is a schematic circuit diagram of a plurality of second resistance switches and a plurality of second resistor elements of the LED illumination device according to the second embodiment of the present disclosure.

More particularly, referring to FIG. 6 to FIG. 8, the first resistance switching module 4A includes a plurality of first resistance switches 41A and a plurality of first resistor elements 42A respectively corresponding to (or selectively electrically connecting to) the first resistance switches 41A, and the second resistance switching module 4B includes a plurality of second resistance switches 41B and a plurality of second resistor elements 42B respectively corresponding to (or selectively electrically connecting to) the second resistance switches 41B.

For example, referring to FIG. 6 to FIG. 8, each of the first resistance switches 41A includes a first exposed physical switching key 411A and a first movable conductive element (not shown) connected to the first physical switching key 411A, and each of the second resistance switches 41B includes a second exposed physical switching key 411B and a second movable conductive element (not shown) connected to the second physical switching key 411B. In addition, the first physical switching key 411A can be movably disposed on a first resistance ON position (ON) for allowing the first direct current DC to pass through the corresponding first resistor element 42A, or movably disposed on a first resistance OFF position (OFF) for preventing (such as stopping or blocking) the first direct current DC from passing through the corresponding first resistor element 42A. Moreover, the second physical switching key 411B can be movably disposed on a second resistance ON position (ON) for allowing the second direct current DC to pass through the corresponding second resistor element 42B, or movably disposed on a second resistance OFF position (OFF) for preventing (such as stopping or blocking) the second direct current DC from passing through the corresponding second resistor element 42B. However, the aforementioned description is merely an example and is not meant to limit the scope of the present disclosure.

More particularly, referring to FIG. 6 and FIG. 7, the first resistance switching module 4A includes a first carrying casing 40A (such as a carrier body) disposed on the circuit substrate 1, and the first physical switching key 411A of each of the first resistance switches 41A can be exposed from the first carrying casing 40A. Therefore, the first physical switching key 411A of each of the first resistance switches 41A can be movably disposed on the first carrying casing 40A, so that the first movable conductive element (not shown) can be switched by the corresponding first physical switching key 411A so as to electrically connect to the corresponding first resistor element 42A (the first physical switching key 411A is disposed on the first resistance ON position (ON)) or electrically insulated from the corresponding first resistor element 42A (the first physical switching key 411A is disposed on a first resistance OFF position (OFF). However, the aforementioned description is merely an example and is not meant to limit the scope of the present disclosure.

More particularly, referring to FIG. 6 and FIG. 8, the second resistance switching module 4B includes a second carrying casing 40B (such as a carrier body) disposed on the circuit substrate 1, the second physical switching key 411B of each of the second resistance switches 41B can be exposed from the second carrying casing 40B, and the second physical switching key 411B of each of the second resistance switches 41B can be movably disposed on the second carrying casing 40B, so that the second movable conductive element (not shown) can be switched by the corresponding second physical switching key 411B so as to electrically connect to the corresponding second resistor element 42B (the second physical switching key 411B is disposed on the second resistance ON position (ON)) or electrically insulated from the corresponding second resistor element 42B (the second physical switching key 411B is disposed on a second resistance OFF position (OFF). However, the aforementioned description is merely an example and is not meant to limit the scope of the present disclosure.

More particularly, referring to FIG. 6, the first LED group 5A includes a plurality of first LED chips 50A disposed on the circuit substrate 1 and electrically connected to the circuit substrate 1, and the second LED group 5B includes a plurality of second LED chips 50B disposed on the circuit substrate 1 and electrically connected to the circuit substrate 1. For example, the first LED chips 50A can be used to generate a first light source, the second LED chips 50B can be used to generate a second light source, and a wavelength of the first light source generated by the first LED chips 50A is different from or the same as a wavelength of the second light source generated by the second LED chips 50B. In addition, the first LED chip 50A or the second LED chips 50B may be a blue LED chip, a green LED chip, a red LED chip or any color LED chip. It should be noted that the first LED chip 50A and the second LED chips 50B are staggered with respect to each other so as to increase the light-mixing effect (or the light-blending effect) of the first light source generated by the first LED chips 50A and the second light source generated by the second LED chips 50B. However, the aforementioned description is merely an example and is not meant to limit the scope of the present disclosure.

Third Embodiment

Figure 9:
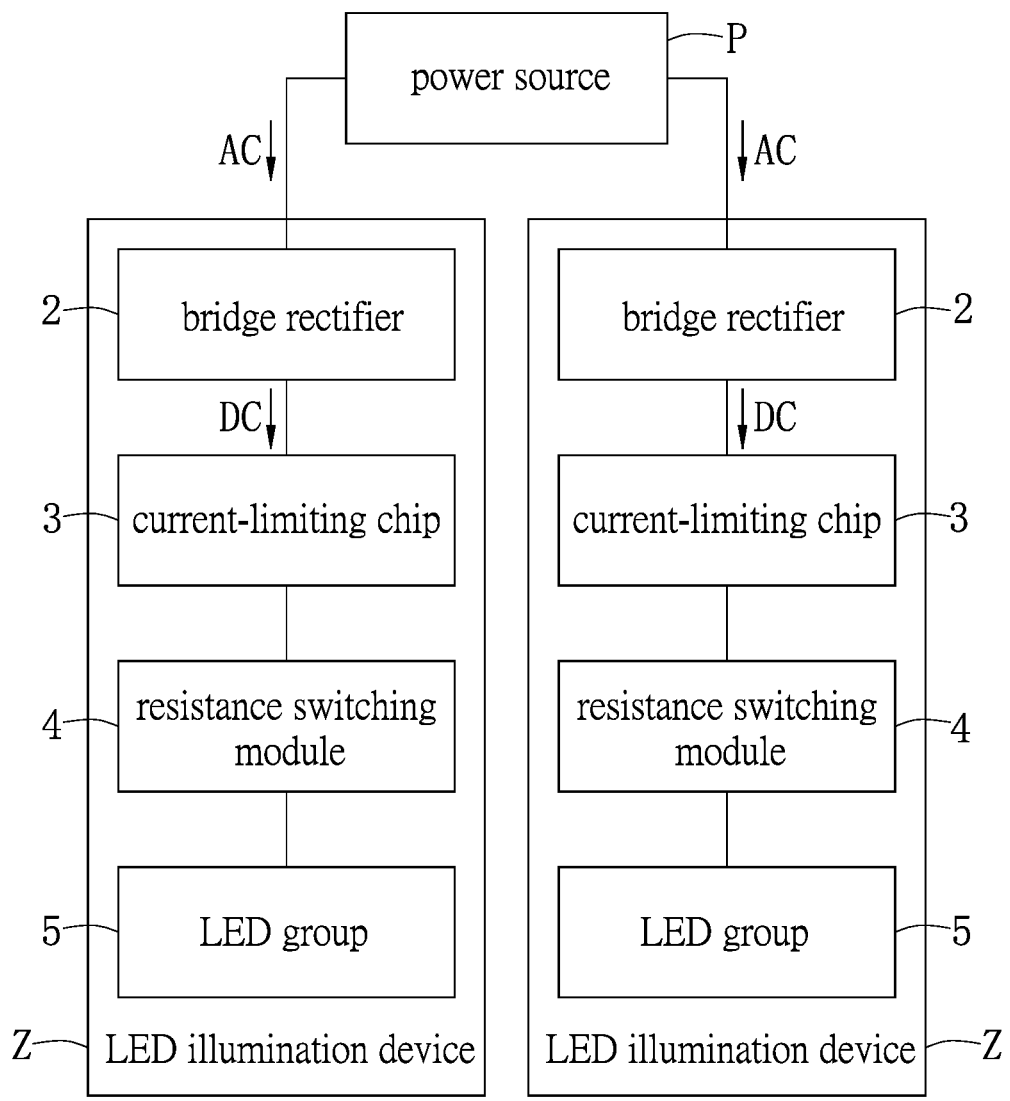
FIG. 9 is a functional block diagram of two LED illumination devices according to a third embodiment of the present disclosure.

Referring to FIG. 9, a third embodiment of the present disclosure provides at least two LED illumination devices Z for generating a mixed light source with adjustable color temperature, and each of the at least two LED illumination devices Z includes a circuit substrate 1, a bridge rectifier 2, a current-limiting chip 3, a resistance switching module 4 and an LED group 5. For example, one of the at least two LED illumination devices Z has a high color temperature, and another one of the at least two LED illumination devices Z has a low color temperature.

In conclusion, by virtue of "the resistance switching module 4 including a plurality of resistance switches 41 and a plurality of resistor elements 42 respectively corresponding to the resistance switches 41" and "each of the resistance switches 41 including a physical switching key 411 that is exposed", the physical switching key 411 can be movably disposed on a resistance ON position (ON) for allowing the direct current DC to pass through the corresponding resistor element 42 (the resistor element 42 is electrically conducted to the LED illumination devices Z), or a resistance OFF position (OFF) for preventing (such as stopping or blocking) the direct current DC from passing through the corresponding resistor element 42 (the resistor element 42 is electrically insulated from the LED illumination devices Z).

It should be noted that the resistor elements 42 of the LED illumination devices Z can be used selectively for adjusting the current value by controlling the resistance switches 41 so as to adjust the brightness (such as the electrical power) of the LED illumination devices Z. In addition, in the present disclosure, an LED illumination device Z having a high color temperature and another LED illumination device Z having a low color temperature can be used in cooperation so as to obtain a mixed light source with adjustable color temperature. Hence, the LED illumination devices Z of the present disclosure can reduce cost, and provide customizable options and multi-functionality.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An LED illumination device, comprising:
a circuit substrate;
a bridge rectifier disposed on the circuit substrate and electrically connected to the circuit substrate;
a first current-limiting chip disposed on the circuit substrate and electrically connected to the circuit substrate;
a second current-limiting chip disposed on the circuit substrate and electrically connected to the circuit substrate;
a first resistance switching module disposed on the circuit substrate and electrically connected to the circuit substrate;
a second resistance switching module disposed on the circuit substrate and electrically connected to the circuit substrate;
a first LED group including a plurality of first LED chips disposed on the circuit substrate and electrically connected to the circuit substrate; and
a second LED group including a plurality of second LED chips disposed on the circuit substrate and electrically connected to the circuit substrate;
wherein the bridge rectifier, the first current-limiting chip, the first resistance switching module and the first LED group are electrically connected with each other;
wherein the bridge rectifier, the second current-limiting chip, the second resistance switching module and the second LED group are electrically connected with each other;
wherein a first electric power received by the first LED group is different from or the same as a second electric power received by the second LED group;
wherein the first resistance switching module includes a plurality of first resistance switches and a plurality of first resistor elements respectively corresponding to the first resistance switches, and each of the first resistance switches includes a first physical switching key that is exposed;
wherein the second resistance switching module includes a plurality of second resistance switches and a plurality of second resistor elements respectively corresponding to the second resistance switches, and each of the second resistance switches includes a second physical switching key that is exposed.

2. The LED illumination device according to claim 1, wherein the bridge rectifier is electrically connected to a power source, and an alternating current generated by the power source is converted into a first direct current and a second direct current through the bridge rectifier; wherein the first current-limiting chip is electrically connected to the bridge rectifier so as to adjust a first current value of the first direct current, and the second current-limiting chip is electrically connected to the bridge rectifier so as to adjust a second current value of the second direct current.

3. The LED illumination device according to claim 2, wherein the first physical switching key is movably disposed on a first resistance ON position for allowing the first direct current to pass through the corresponding first resistor element, or a first resistance OFF position for preventing the first direct current from passing through the corresponding first resistor element; wherein the second physical switching key is movably disposed on a second resistance ON position for allowing the second direct current to pass through the corresponding second resistor element, or a second resistance OFF position for preventing the second direct current from passing through the corresponding second resistor element.

4. The LED illumination device according to claim 1, wherein the first resistance switching module includes a first carrying casing disposed on the circuit substrate, the first physical switching key of each of the first resistance switches is exposed from the first carrying casing, and the first physical switching key of each of the first resistance switches is movably disposed on the first carrying casing.

5. The LED illumination device according to claim 4, wherein the second resistance switching module includes a second carrying casing disposed on the circuit substrate, the second physical switching key of each of the second resistance switches is exposed from the second carrying casing, and the second physical switching key of each of the second resistance switches is movably disposed on the second carrying casing.

\* \* \* \* \*